United States Patent [19]

Hosokoshi et al.

[11] 4,135,930
[45] Jan. 23, 1979

[54] METHOD FOR MANUFACTURING THE PHOSPHOR SCREEN OF COLOR-PICTURE TUBE

[75] Inventors: Kakuichiro Hosokoshi, Neyagawa; Hiroto Nakamura; Akira Sato, both of Takatsuki; Masakazu Maeda, Ibaraki, all of Japan

[73] Assignee: Matsushita Electronics Corporation, Osaka, Japan

[21] Appl. No.: 755,952

[22] Filed: Dec. 30, 1976

Related U.S. Application Data

[63] Continuation of Ser. No. 555,713, Mar. 6, 1975, abandoned.

[30] Foreign Application Priority Data

Mar. 7, 1974 [JP] Japan .................................. 49-26886

[51] Int. Cl.[2] .............................................. G03C 5/00
[52] U.S. Cl. .................................. 96/36.1; 96/27 E; 354/1
[58] Field of Search ............... 96/27 E, 36.1; 354/1; 427/68

[56] References Cited

U.S. PATENT DOCUMENTS

| 3,003,874 | 10/1961 | Kaplan | 96/36.1 |
|---|---|---|---|
| 3,279,340 | 10/1966 | Ramberg et al. | 96/36.1 |
| 3,282,691 | 11/1966 | Morrell et al. | 96/36.1 |
| 3,429,704 | 2/1969 | Ratliff | 96/36.1 |
| 3,437,482 | 4/1969 | Yamada et al. | 96/36.1 |
| 3,582,326 | 6/1971 | Smithgall | 96/36.1 |
| 3,738,233 | 6/1973 | Schwartz | 95/1 R |
| 3,883,880 | 5/1975 | Yamazaki et al. | 354/1 |

*Primary Examiner*—Edward C. Kimlin
*Attorney, Agent, or Firm*—Burgess, Ryan and Wayne

[57] ABSTRACT

In a process for exposing a photosensitive layer formed upon the inside of the faceplate of a color-picture tube so as to form a desired pattern of phosphor dots or temporary dots or the like, an optical correction system for causing the light beam to precisely impinge at a point where the electron beam impinges is interposed between a light source and a shadow mask. The system comprises an optical lens system for correcting ΔS deviation characteristics and an optical lens system for correcting ΔP deviation characteristics consisting of a first optical correction system and a second optical system. The first optical system is so designed as to attain the average correction depending only upon the deflection angle regardless of each of the radial directions of deflection while the second optical system is so designed as to attain the individual ΔP deviation characteristics depending not only upon the deflection angle but also upon each of the radial directions of deflection. The correction lenses may have a relatively simple aspherical surface.

3 Claims, 6 Drawing Figures

FIG. 4
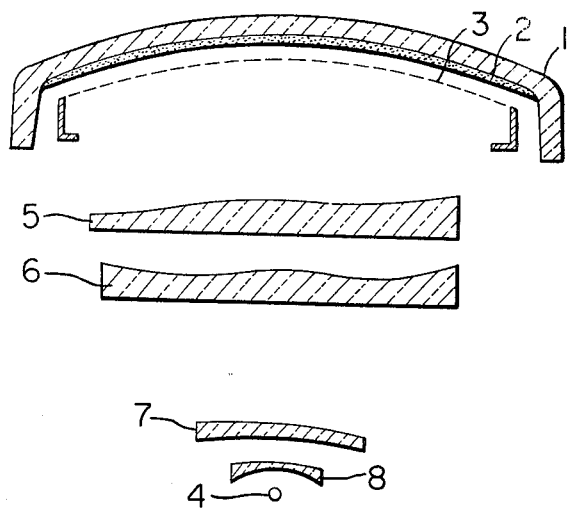
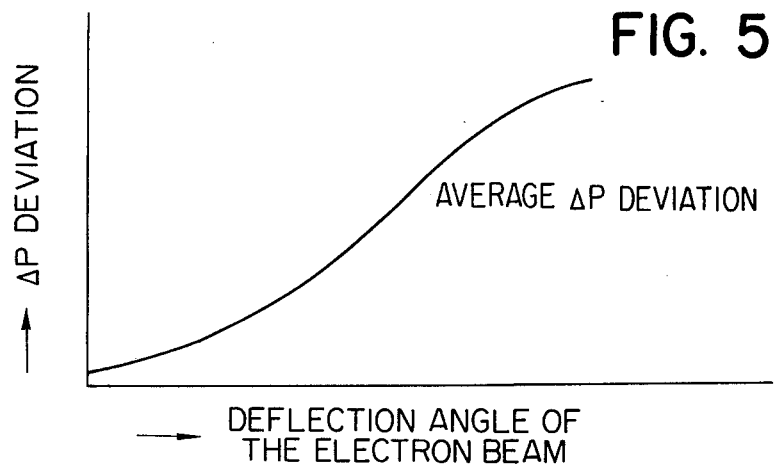
FIG. 5
FIG. 6

METHOD FOR MANUFACTURING THE PHOSPHOR SCREEN OF COLOR-PICTURE TUBE

This is a continuation, of application Ser. No. 555,713, filed Mar. 6, 1975 now abandoned.

BACKGROUND OF THE INVENTION

The present invention relates to generally a method for manufacturing color-picture tubes, and more particularly a method for exposing a photosensitive layer uniformly coated upon the inner surface of the faceplate of the picture tube so as to form a desired phosphor dot pattern or the like.

In the step of exposing a photosensitive layer uniformly deposited upon the inner surface of the faceplate of a color-picture tube so as to form a desired phosphor screen pattern, a desired spot is exposed by the light beam emitted from a point light source located at one of the centers of deflection and projected through an optical correction lens system and a shadow mask. Thereafter, the exposed layer is developed so that the phosphor or temporary dots or stripes may be formed.

The optical correction lens system interposed between the light source and the shadow mask consists of a single or a plurality of correction lenses with a complicated aspherical surface so that the light beam may precisely impinge at a point where the corresponding electron beam impinges. To form the phosphor screen of a color-picture tube of the type with a wide deflection angle such as with a 110° deflection angle, a very complex optical correction lens system is required, and it is very difficult to manufacture aspherical correction lenses having such a complicated surface.

SUMMARY OF THE INVENTION

One of the objects of the present invention is therefore to provide an improved optical correction lens system for use in the exposure step in the color-picture tube production process which system comprises a plurality of aspherical correction lenses with less complex surface curvatures.

Another object of the present invention is to provide an improved optical correction lens system of the type described which may attain the required correction with a high degree of accuracy and may facilitate the operation and adjustment of the exposure step.

According to the present invention, a plurality of correction lenses are used each for attaining a specific correction. According to one aspect of the present invention, a first optical correction lens system is provided only for attaining the correction for the $\Delta S$ deviation characteristic to be described in detail hereinafter, and another optical correction system for attaining the correction for the $\Delta P$ deviation characteristic to be described in more detail hereinafter. The latter system comprises a first optical correction system for attaining the rough or average correction only depending upon the deflection angle and a second optical correction system for attaining the fine or individual correction for $\Delta P$ deviations corresponding to the individual radial direction depending upon the angle of deflection. Therefore, the design and manufacture of the correction lenses may be much facilitated.

BRIEF DESCRIPTION OF THE DRAWING

FIG. 4 is a sectional view of an optical correction lens system of one embodiment in accordance with the present invention; and FIGS. 5 and 6 are diagrams used for the explanation of the first and second optical correction systems, respectively, and for the $\Delta P$ deviation characteristics in accordance with the present invention.

DESCRIPTION OF THE PREFERRED EMBODIMENT

Principle, FIGS. 1 through 5

Prior to the description of the preferred embodiment of the present invention, the underlying principle thereof will be described in detail hereinafter for the sake of better understanding thereof.

As is well known in the art, when the deflection angle of the electron beam in the color-picture tube increases, the deflection center thereof deviates. Therefore, in case of exposure of a photosensitive material uniformly coated over the inside of the faceplate for forming a desired pattern of, for instance, temporary dots, the apparent position of the point light source must be, in general, displaced accordingly through the $\Delta P$ deviation correction optical system in the axial direction of the picture tube and through the $\Delta S$ deviation correction optical system in the radial directions in a plane perpendicular to the axis of the picture tube.

In the present invention, in order to facilitate the manufacture of correction lenses; that is, in order to give rather simple curvatures to the surfaces of the correction lenses, the $\Delta P$ deviation correction optical system is made up of two correction lenses.

Figure 1:
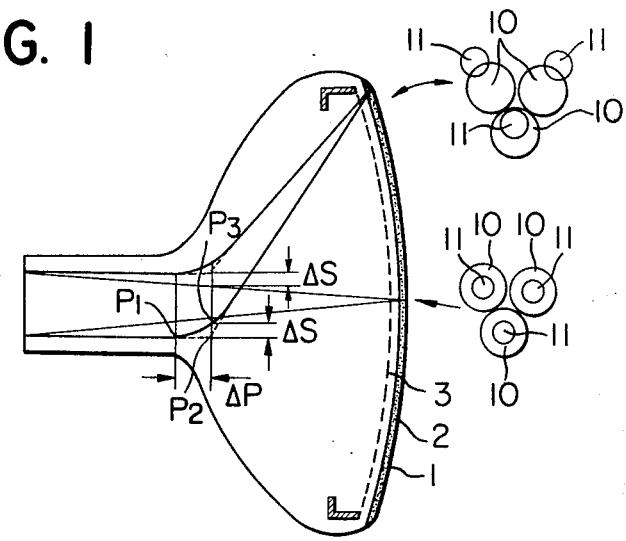
FIG. 1 is a diagram used for the explanation of the underlying principle of the present invention and of the terms "$\Delta P$ and $\Delta S$ deviation characteristics" used in this specification.
Figure 2:
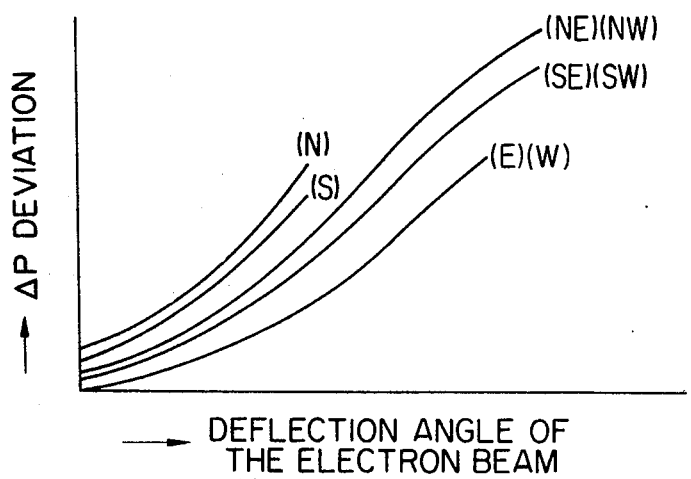
FIG. 2 is a diagram illustrating the $\Delta P$ deviation characteristic depending upon the deflection angle and the direction of deflection.
Figure 3:
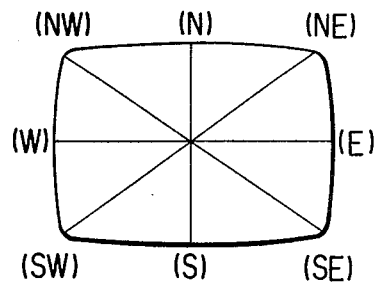
FIG. 3 is a diagram used for the explanation of the directions of the deflection on the screen of a picture tube.

Referring to FIG. 1, as the deflection angle of the electron beam increases, the deflection center $P_1$ is displaced by $\Delta P$ in the axial direction toward the screen to the point $P_2$. This displacement is referred to as the "$\Delta P$ deviation characteristic" in this specification. In the exposure step, the $\Delta P$ deviation characteristic correction or compensation must be made so that the light beam may impinge precisely at a point where the electron beam impinges. For this purpose, the apparent position of the point light source must be optically displaced in the axial direction toward the screen. Otherwise the electron beam cannot precisely impinge at the predetermined phosphor dot. As shown in FIG. 2, the greater the deflection dot. As shown in FIG. 2, the greater the deflection angle,the greater the $\Delta P$ deviation becomes, and the $\Delta P$ deviation also differs depending upon the radial directions in a screen as shown in FIGS. 2 and 3.

As shown in FIG. 1, the center of deflection of the electron beam is also displaced in the radial directions in a plane perpendicular to the axis of the electron beam source under the influence of the so-called dynamic convergence for converging the three electron beams to a common point on the shadow mask. The above displacement is referred to as the "$\Delta S$ deviation characteristic" in this specification. In the exposure, the $\Delta S$ deviation characteristic correction or compensation must be also made so that the light beam may precisely impinge at a point where the electron beam impinges. For this purpose, the apparent position of the point source must be optically displaced in the radial direction in a plane perpendicular to the axis of the picture tube. If the ΔP and ΔS deviation corrections are not made, the electron beams 11 cannot impinge precisely on the corresponding phosphor dot 10 of color triad as shown in FIG. 1.

If the ΔP and ΔS deviation corrections are carried out by a single correction plate, the aspheric surface thereof would become very complex so that it is extremely difficult to obtain an optically satisfactory correction lens. In order to overcome this problem, the correction lens for the ΔP deviation correction and the correction lens for the ΔS deviation correction are individually used. Furthermore, as described above, the ΔP deviation correction system is made up of two correction lenses so that the correction lenses with less complicated surface curvatures may be used. Thus, the overall correction system is made up of three correction lenses. The first ΔP deviation correction lens is used for attaining the rough or average correction only depending upon the deflection angle as shown in FIG. 5 while the second correction plate is used for attaining the fine or individual correction depending upon the asymmetrical component of the radial direction of the deflection as shwon in FIG. 6. Therefore, the surface of the correction plate utilizes less complex curvatures, and an ideal optical compensation system may be provided in a simple manner.

EXAMPLE, FIG. 4

One example of the present invention is shown in FIG. 4 wherein a photosensitive layer 2 is uniformly coated on an inside of a faceplate 1, and a shadow mask 3 is located and spaced apart from the faceplate 1 by a predetermined distance. Between the shadow mask 3 and a lamp house with a light source 4 are interposed an optical correction system 5 for correcting the ΔS deviation, a first and second optical correction systems 6 and 7 for correcting the ΔP deviation, and a correction lens 8 for correcting the apparent size of the light source or light emitting point.

The correction lens 5 for the ΔS deviation has a flat surface and an aspherical surface. Even though the aspherical surface of the correction lens 5 is rather more complex than those of the correction lenses 6, 7 and 8, it may be formed in a relatively simple manner so that the ideal correction for ΔS deviation may be attained because the correction of the ΔP deviation is not required to be taken into consideration in lens design.

As described elsewhere, the first correction lens 6 for the ΔP deviation is used for attaining the rough or average correction of ΔP deviation in all radial directions depending only upon the angle of deflection as shown in FIG. 5. Therefore, the design of the correction lens 6 may be simplified, and its aspherical surface is rotationally symmetric with respect to its optical axis and may be produced in a simple manner. The second correction lens 7 is used for attaining the fine correction of ΔP deviation in all radial directions because the ΔP deviation is different depending upon each radial direction of deflection as shown in FIG. 2. Therefore, the aspherical surface of the second correction leans 7 is so designed that the ΔP deviation may be corrected depending upon both the deflection angle and upon each radial direction of deflection as shown in FIG. 6, where each deviation curve indicates the ΔP deviation obtained by the difference of the average deviation shown in FIG. 5 from the deviation in each direction shown in FIG. 2. Therefore the design of the second correction lens 7 may be greatly facilitated, and its aspherical surface may be produced in a simple manner, because its surface can be formed combining a plurality of simple circular curved surfaces.

Next the method for designing such correction lenses will be described. First, a color-picture tube which was manufactured without the use of the optical corrected system in the exposure step or with the use of the optical correction system whose characteristic are known, is prepared and energized so as to investigate the deviation from a predetermined phosphor dot of a point at which the electron beam impinges and, the diameters of the phosphor dots. From this data, the average ΔP deviation depending upon the deflection angle, the individual ΔP deviations depending upon the asymmetrical component of the radial directions of deflection, and the ΔS deviation are calculated so that the correction lenses 5, 6 and 7 may be designed. After the overall optical correction system consisting of the correction lenses 5, 6 and 7 is assembled, the deviation due to the overall correction system is measured and modified accordingly. In this case, the light source correction lens 8 may be corrected instead of correcting partially the lenses 5, 6 and 7. Alternatively, a dot grade correction filter which is inserted into the optical correction system for the purpose of obtaining uniform illumination over the photosensitive layer may be so designed as to attain a partial correction of ΔP deviation characteristics.

Furthermore, each of the correction lenses of the above mentioned optical lens system may not necessarily be a single lens, but may be formed by plurality of lenses combined.

In the case of the in-line three electron gun type color-picture tubes wherein the three electron guns are arrayed in line, the electron beam emitted from the central electron gun has no ΔS deviation so that it is not necessary to introduce ΔS correction in case of exposure for this type of picture tube.

As described above, according to the present invention the overall optical correction system used for exposure of color-picture tubes is made up of three correction lenses or systems, the first lens or system correcting ΔS deviation, the second lens or system for attaining the rough or average correction of ΔP deviation depending, only upon the deflection angle, and the third lens or system for attaining the fine or individual correction of ΔP deviation in each radial direction. Therefore the design of the correction lenses or systems may be much facilitated, and the aspherical surfaces of the correction lenses may be produced in a simple manner. So far the present invention has been described as being used for producing dot trios, but it is to be understood that the present invention may be applied also to the exposure for forming phosphor stripes or temporary dots or stripes.

What is claimed is:

1. A method for manufacturing color-picture tubes characterized in that in the step for exposing picture tubes characterized in that in the step for exposing selectively a photosensitive layer applied on a faceplate by the light beam projecting from a light source through an optical correction system comprising
    (a) an optical correction lens system only for correcting the Δs deviation, and (b) an optical correction lens system for correcting the ΔP deviation consisting of a first optical correction lens and a second optical correction lens, said first optical correction lens having a rotationally symmetrical shape and being so designed as to attain the correction for the ΔP deviation with equal extent to all of radial direction components only depending upon the deflection angle and by an average amount depending upon all of the radial direction components of the deflection angle and regardless of the individual radial direction of deflection, said second optical correction lens being so designed as to attain the individual correction for the ΔP deviation depending not only upon the deflection angle but also upon each asymmetrical component of the radial directions of deflection where ΔP is the difference measured axially and ΔS is the difference measured radially between the actual and apparent center of deflection of the picture tube electron.

2. A method as set forth in claim 1 wherein said optical correction system further comprises a correction lens for correcting the apparent size and shape of said light source, which lens system is so designed as to attain a partial correction for said ΔP or ΔS deviation.

3. A method as set forth in claim 2 wherein said optical correction system further comprises a dot grade correction filter for improving uniform brightness over the whole surface of the screen of the picture tube, which filter is so designed as to attain a partial correction for said ΔP or ΔS deviation.

* * * * *

UNITED STATES PATENT OFFICE
CERTIFICATE OF CORRECTION

Patent No. 4,135,930                    Dated January 23, 1979

Inventor(s) Kakuichiro Hosokosho, et al.

It is certified that error appears in the above-identified patent and that said Letters Patent are hereby corrected as shown below:

Column 3, line 28: change "shwon" to --shown--.

Column 4, lines 62 and 63: cancel "picture tubes characterized in that in the step for exposing".

Signed and Sealed this

Tenth Day of July 1979

[SEAL]

Attest:

LUTRELLE F. PARKER
Attesting Officer    Acting Commissioner of Patents and Trademarks